United States Patent
Gidney

(10) Patent No.: US 11,586,969 B2
(45) Date of Patent: Feb. 21, 2023

(54) QUANTUM CIRCUIT OPTIMIZATION USING WINDOWED QUANTUM ARITHMETIC

(71) Applicant: Google LLC, Mountain View, CA (US)

(72) Inventor: Craig Gidney, Goleta, CA (US)

(73) Assignee: Google LLC, Mountain View, CA (US)

( * ) Notice: Subject to any disclaimer, the term of this patent is extended or adjusted under 35 U.S.C. 154(b) by 259 days.

(21) Appl. No.: 16/833,250

(22) Filed: Mar. 27, 2020

(65) Prior Publication Data
US 2020/0311592 A1 Oct. 1, 2020

Related U.S. Application Data

(60) Provisional application No. 62/826,142, filed on Mar. 29, 2019.

(51) Int. Cl.
| | | |
|---|---|---|
| G06F 17/10 | (2006.01) | |
| G06N 10/00 | (2022.01) | |
| G11C 11/4063 | (2006.01) | |
| G06F 7/48 | (2006.01) | |
| G06F 7/72 | (2006.01) | |
| G06F 7/505 | (2006.01) | |
| H04B 10/70 | (2013.01) | |

(52) U.S. Cl.
CPC ........... *G06N 10/00* (2019.01); *G06F 7/4824* (2013.01); *G06F 7/505* (2013.01); *G06F 7/5057* (2013.01); *G06F 7/72* (2013.01); *G06F 17/10* (2013.01); *G11C 11/4063* (2013.01); *H04B 10/70* (2013.01)

(58) Field of Classification Search
USPC ........................................................ 359/107
See application file for complete search history.

(56) References Cited

U.S. PATENT DOCUMENTS

2013/0311532 A1 11/2013 Olsen
2018/0113708 A1 4/2018 Corbal et al.
(Continued)

FOREIGN PATENT DOCUMENTS

CN 107683460 2/2018

OTHER PUBLICATIONS

6. Van Meter, Rodney, Trading Classical for Quantum Computation Using Indirection, Apr. 29, 2004 (Apr. 29, 2004), XPO55716093 (Year: 2004).*
(Continued)

*Primary Examiner* — Bryce M Aisaka
(74) *Attorney, Agent, or Firm* — Fish & Richardson P.C.

(57) ABSTRACT

Methods, systems and apparatus for performing windowed quantum arithmetic. In one aspect, a method for performing a product addition operation includes: determining multiple entries of a lookup table, comprising, for each index in a first set of indices, multiplying the index value by a scalar for the product addition operation; for each index in a second set of indices, determining multiple address values, comprising extracting source register values corresponding to indices between i) the index in the second set of indices, and ii) the index in the second set of indices plus the predetermined window size; and adjusting values of a target quantum register based on the determined multiple entries of the lookup table and the determined multiple address values.

27 Claims, 7 Drawing Sheets

(56) References Cited

U.S. PATENT DOCUMENTS

2018/0240032 A1 8/2018 Rooyen
2019/0042971 A1 2/2019 Zou

OTHER PUBLICATIONS

Office Action in Chinese Appln. No. 202080025632.7, dated May 25, 2022, 16 pages.
PCT International Search Report and Written Opinion in International Appln. No. PCT/US2020/025445, dated Aug. 12, 2020, 23 pages.
Van Meter, "Trading Classical For Quantum Computation Using Indirection," Apr. 29, 2004, retrieved on Oct. 2, 2020, retrieved from URL <https://web.sfc.keio.ac.jp/~rdv/quantum/publications/pay-the-exponential-full-inline.pdf>, 6 pages.
Wiebe et al., "Quantum arithmetic and numerical analysis using Repeat-Until-Success circuits," CoRR, Jun. 2014, https://arxiv.org/abs/1406.2040v2, 32 pages.
Alagic et al., "Status Report on the First Round of the NIST Post-Quantum Cryptography Standardization Process," Tech. Rep., National Institute of Standards and Technology, Jan. 2019, 27 pages.
Apps.nsa.gov [online], "CNSA Suite and Quantum Computing FAQ," retrieved from URL <https://apps.nsa.gov/iaarchive/library/ia-guidance/ia-solutions-for-classified/algorithm-guidance/cnsa-suite-and-quantum-computing-faq.cfm>, Jan. 2016, 11 pages.
Babbush et al., "Encoding Electronic Spectra in Quantum Circuits with Linear T Complexity," Physical Review X, Oct. 2018, 041015-1-041015-36.
Barends et al., "Superconducting quantum circuits at the surface code threshold for fault tolerance," Nature, Apr. 2014, 508:500-503.
Beauregard, "Circuit for Shor's algorithm using 2n+3 qubits," https://arxiv.org/abs/quant-ph/0205095v1, May 2002, 13 pages.
Berry et al., "Qubitization of Arbitrary Basis Quantum Chemistry by Low Rank Factorization," https://arxiv.org/abs/1902.02134v1, Feb. 2019, 20 pages.
Bocharov et al., "Efficient Synthesis of Universal Repeat-Until-Success Circuits," https://arxiv.org/abs/1404.5320v1, Apr. 2014, 16 pages.
Braithwaite, "Experimenting with Post-Quantum Cryptography," retrieved from URL <https://security.googleblog.com/2016/07/experimenting-with-post-quantum.html>, Jul. 2016, 5 pages.
Bravyi et al., "Universal quantum computation with ideal Clifford gates and noisy ancillas," Physical Review A, Feb. 2005, 71:022316-1-022316-14.
Buhler et al., "Factoring integers with the No. field sieve," in The Development of the Number Field Sieve, Lecture Notes in Mathematics (LNM), 1993, 1554:50-94.
Campbell et al., "Applying quantum algorithms to constraint satisfaction problems," https://arxiv.org/abs/1810.05582v1, Oct. 2018, 26 pages.
Cuccaro et al., "A new quantum ripple-cany addition circuit," https://arxiv.org/abs/quant-ph/0410184, Oct. 2004, 9 pages.
de Beaudrap et al., "The ZX calculus is a language for surface code lattice surgery," https://arxiv.org/abs/1704.08670v1, Apr. 2017, 19 pages.
Diffie et al., "New Directions in Cryptography," IEEE Transactions on Information Theory, Nov. 1976, 22(6):644-654.
Draper et al., "A logarithmic-depth quantum cany-lookahead adder," https://arxiv.org/abs/quant-ph/0406142, Jun. 2004, 21 pages.
Eastin, "Distilling one-qubit magic states into Toffoli states," Physical Review A, Mar. 2013, 87:032321-1-032321-7.
Ekera et al., "Quantum Algorithms for Computing Short Discrete Logarithms and Factoring RSA Integers," International Workshop on Post-Quantum Cryptography, Jun. 2017, 347-363.
Ekera, "Modifying Shor's algorithm to compute short discrete logarithms," retrieved from URL <https://eprint.iacr.org/2016/1128.pdf>, Dec. 2016, 26 pages.
Ekera, "On post-processing in the quantum algorithm for computing short discrete logarithms," retrieved from URL <https://eprintiacr.org/2017/1122.pdf>, Feb. 2019, 19 pages.
Ekera, "Quantum algorithms for computing general discrete logarithms and orders with tradeoffs," retrieved from URL <https://eprint.iacr.org/2018/797.pdf>, Mar. 2020, 52 pages.
Ekera, "Revisiting Shor's quantum algorithm for computing general discrete logarithms," https://arxiv.org/abs/1905.09084, May 2019, 13 pages.
Fowler et al., "A bridge to lower overhead quantum computation," https://arxiv.org/abs/1209.0510v1, Sep. 2012, 15 pages.
Fowler et al., "Low overhead quantum computation using lattice surgery," https://arxiv.org/abs/1808.06709v1, Aug. 2018, 15 pages.
Fowler et al., "Surface codes: Towards practical large-scale quantum computation," Physical Review A, Sep. 2012, 86:032324-1-032324-48.
Fowler et al., "Surface code implementation of block code state distillation," Scientific Reports, Jun. 2013, 3(1939):1-6.
Fowler, "Time-optimal quantum computation," https://arxiv.org/abs/1210.4626v1, Oct. 2012, 5 pages.
Gheorghiu et al., "Quantum cryptanalysis of symmetric, public-key and hash-based cryptographic schemes," https://arxiv.org/abs/1902.02332v1, Feb. 2019, 19 pages.
Gidney et al., "Efficient magic state factories with a catalyzed |CCZ> to 2|T> transformation," https://arxiv.org/abs/1812.01238v1, Dec. 2018, 24 pages.
Gidney et al., "How to factor 2048 bit RSA integers in 7 hours using 23 million noisy qubits," https://arxiv.org/abs/1905.09749, last revised Dec. 2019, 26 pages.
Gidney et al., "How to factor 2048 bit RSA integers in 7 hours using 23 million noisy qubits," https://arxiv.org/abs/1905.09749v1, May 2019, 25 pages.
Gidney et al., "Efficient magic state factories with a catalyzed |CCZ> to 2|T> transformation," https://arxiv.org/abs/1812.01238v3, last revised Apr. 2019, 24 pages.
Gidney et al., "Flexible layout of surface code computations using AutoCCZ states," https://arxiv.org/abs/1905.08916, May 2019, 17 pages.
Gidney, "Factoring with n+2 clean qubits and n-1 dirty qubits," https://arxiv.org/abs/1706.07884v1, Jun. 2017, 13 pages.
Gidney, "Halving the cost of quantum addition," Quantum 2, Jun. 2018, 6 pages.
Gidney, "Approximate encoded permutations and piecewise quantum adders," https://arxiv.org/abs/1905.08488, May 2019, 15 pages.
Gidney, "Asymptotically Efficient Quantum Karatsuba Multiplication," https://arxiv.org/abs/1904.07356, Apr. 2019, 11 pages.
Gidney, "Windowed quantum arithmetic," https://arxiv.org/abs/1905.07682, May 2019, 11 pages.
Gillmor, "RFC 7919: Negotiated Finite Field Diffie-Hellman Ephemeral Parameters for Transport Layer Security (TLS)," retrieved from URL <https://www.hjp.at/doc/rfc/rfc7919.html>, Aug. 2016, 30 pages.
Github.com [online], "OpenSSL Software Foundation, Openssl source code: Line 32 of apps/dhparam.c," retrieved from URL <https://github.com/openssl/openssl/blob/07f434441e7ea385f975e8df8caa03e62222ca61/apps/dhparam.c#L32>, Dec. 2018, 6 pages.
Github.com [online], "Quirk: A drag-and-drop quantum circuit simulator for exploring small quantum circuits," available on or before Jun. 11, 2018, via Internet Archive: Wayback Machine URL <https://web.archive.org/web/20180611035822/https://github.com/Strilanc/Quirk>, retrieved on Jun. 30, 2020, URL <https://github.com/Strilanc/Quirk>, 3 pages.
Gnupg.org [online], "GnuPG frequently asked questions—11.2 Why Does GnuPG Default to 2048 bit RSA-2048?" available on or before Jul. 1, 2016, via Internet Archive: Wayback Machine URL <https://web.archive.org/web/20160701194147/https://www.gnupg.org/faq/gnupg-faq.html#default_rsa2048>, retrieved on Jun. 29, 2020, URL <https://www.gnupg.org/faq/gnupg-faq.html#default_rsa2048>, 22 pages.
Gordon, "Discrete logarithms in GF(p) using the Number Field Sieve," SIAM Journal on Discrete Mathematics, 1993, 6:124-138.

(56) References Cited

OTHER PUBLICATIONS

Gottesman et al., "Demonstrating the viability of universal quantum computation using teleportation and single-qubit operations," Nature, Nov. 1999, 402:390-393.
Gottesman, "The Heisenberg Representation of Quantum Computers," https://arxiv.org/abs/quant-ph/9807006, Jul. 1998, 20 pages.
Griffiths et al., "Semiclassical Fourier Transform for Quantum Computation," Physical Review Letters, Apr. 1996, 76(17):3228-3231.
Haah et al., "Codes and Protocols for Distilling T, controlled-S, and Toffoli Gates," Quantum 2, retrieved from URL <https://arxiv.org/abs/1709.02832v3>, May 2018, 29 pages.
Haner et al., "Factoring using 2n+2 qubits with Toffoli based modular multiplication," https://arxiv.org/abs/161L07995v1, Nov. 2016, 7 pages.
Hastings et al., "Reduced Space-Time and Time Costs Using Dislocation Codes and Arbitrary Ancillas," https://arxiv.org/abs/1408.3379v1, Aug. 2014, 16 pages.
Horsman et al., "Surface code quantum computing by lattice surgery," New Journal of Physics, Dec. 2012, 28 pages.
Jeandel et al., "A Complete Axiomatisation of the ZX-Calculus for Clifford+T Quantum Mechanics," Proceedings of the 33rd Annual ACM/IEEE Symposium on Logic in Computer Science, Jul. 2018, 10 pages.
Jones, "Low-overhead constructions for the fault-tolerant Toffoli gate," Physical Review A, Feb. 2013, 022328-1-022328-4.
Karatsuba et al., "Multiplication of many-digital numbers by automatic computers," Doklady Akademii Nauk, Russian Academy of Sciences, Feb. 1962, 145(2):293-294 (with English translation).
Keylength.com [online], "BlueKrypt—Cryptographic Key Length Recommendation," available on or before Mar. 3, 2019, via Internet Archive: Wayback Machine URL <https://web.archive.org/web/20190303042857/https://www.keylength.com/>, retrieved on Jun. 29, 2020, URL <https://www.keylength.com>, 1 page.
Kim et al., "Flipping bits in memory without accessing them: An experimental study of DRAM disturbance errors," 2014 ACM/IEEE 41st International Symposium on Computer Architecture (ISCA), Jun. 2014, 12 pages.
Kitaev, "Fault-tolerant quantum computation by anyons," Annals of Physics, Jan. 2003, 303(1):2-30.
Kivinen et al., "RFC 3526: More Modular Exponentiation (MODP) Diffie-Hellman groups for Internet Key Exchange (IKE)," retrieved from URL <https://www.hjp.at/doc/rfc/rfc3526.html>, May 2003, 11 pages.
Kleinjung et al., "Factorization of a 768-Bit RSA Modulus," Lecture Notes in Computer Science: Advanced in Ciyptology: CRYPTO 2010, 2010, 6223:333-350.
Lenstra et al., "Selecting Cryptographic Key Sizes," Journal of Cryptology, 2001, 14:225-293.
Lenstra et al., "The number field sieve," Proceedings of the 22nd Annual ACM Symposium on the Theory of Computing (STOC), 1990, 564-572.
Lenstra, "Key Lengths," The Handbook of Information Security, retrieved from URL <http://citeseerx.ist.psu.edu/viewdoc/download;jsessionid=F4B43E1DEB9BD699COF03EA08A2AD810?doi=10.1.1.694.8206&rep=rep1&type=pdf>, 2004, 32 pages.
Li, "A magic state's fidelity can be superior to the operations that created it," New Journal of Physics, Februaiy 2015, 17:1-7.
Linux.die.net [online], "ssh-keygen(1)—Linux man page," available on or before Mar. 25, 2018, via Internet Archive: Wayback Machine URL <https://web.archive.org/web/20180325042106/https://linux.die.net/man/1/ssh-keygen>, retrieved on Jun. 29, 2020, URL <https://linux.die.net/man/1/ssh-keygen>, 3 pages.
Listserv.nodak.edu [online], "795-bit factoring and discrete logarithms," retrieved from URL <https://listserv.nodak.edu/cgi-bin/wa.exe?A2=NMBRTHRY;fd743373.1912&FT=M&P=T&H=&S=>, Dec. 2, 2019, 2 pages.
Litinski, "A Game of Surface Codes: Large-Scale Quantum Computing with Lattice Surgery," https://arxiv.org/abs/1808.02892v1, Aug. 2018, 35 pages.
Litinski, "Magic State Distillation: Not as Costly as You Think," https://arxiv.org/abs/1905.06903v1, May 2019, 20 pages.
Low et al., "Trading T-gates for dirty qubits in state preparation and unitary synthesis," https://arxiv.org/abs/1812.00954, Dec. 2018, 11 pages.
Mosca et al., "The Hidden Subgroup Problem and Eigenvalue Estimation on a Quantum Computer," Proceeding from the First NASA International Conference: Quantum Computing and Quantum Communications (QCQC1998), May 1999, 1509:174 188.
Mosca, "Cybersecurity in an Era with Quantum Computers: Will We Be Ready?" IEEE Security & Privacy, Oct. 2018, 16(5): 38-41 (2018).
Nist and CCCS, "Implementation Guidance for FIPS 140-2 and the Cryptographic Module Validation Program," retrieved from URL <https://web.archive.org/web/20190313055345/https://csrc.nist.gov/csrc/media/projects/cryptographic-module-validation-program/documents/fips140-2/fips1402ig.pdf, Feb. 5, 2019, 240 pages.
Nist, "Recommendation for Key Management, Part 1: General (SP 800-57 Part 1 Rev. 4)," retrieved from URL <https://nvlpubs.nist.gov/nistpubs/SpecialPublications/NIST.SP.800-57pt1r4.pdf>, Jan. 2016, 161 pages.
Nist, "Recommendation for Pair-Wise Key-Establishment Schemes Using Discrete Logarithm Cryptography (SP 800-56A Rev. 3)," retrieved from URL <https://nvlpubs.nist.gov/nistpubs/SpecialPublications/NIST.SP.800-56Ar3.pdf>, Apr. 2018, 152 pages.
Nist, "Digital Signature Standard (DSS) (FIPS PUB 186-4)," retrieved from URL <https://nvlpubs.nist.gov/nistpubs/FIPS/NIST.FIPS.186-4.pdf>, Jul. 2013, 130 pages.
O'Gorman et al., "Quantum computation with realistic magic-state factories," Physical Review A, Mar. 2017, 032338-1-032338-19.
Parent et al., "Improved reversible and quantum circuits for Karatsuba-based integer multiplication," https://arxiv.org/abs/1706.03419, Jun. 2017, 16 pages.
Parker et al., "Efficient Factorization with a Single Pure Qubit and log N Mixed Qubits," Physical Review Letters, Oct. 2000, 85(14):3049-3052.
Pohlig et al., "An Improved Algorithm for Computing Logarithms over GF(p) and Its Cryptographic Significance," IEEE Transactions on Information Theory, Jan. 1978, 24(1): 106-110.
Pollard, "Factoring with cubic integers," Lecture Notes in Mathematics: The Development of the No. Field Sieve, Oct. 2006, 4-10.
Pollard, "Monte Carlo Methods for Index Computation (mod p)," Mathematics of Computation, Jul. 1978, 32(143):918-924 (1978).
Pollard, "The lattice sieve," The Development of the Number Field Sieve, Lecture Notes in Mathematics (LNM), 1993, 1554:43-49.
Pomerance, "A Tale of Two Sieves," Notices of the AMS, Dec. 1996, 43(12):1473-1485.
Raussendorf et al., "A fault-tolerant one-way quantum computer," Annals of Physics, Sep. 2006, 321(9):2242-2270.
Raussendorf et al., "Fault-Tolerant Quantum Computation with High Threshold in Two Dimensions," Physical Review Letters 98, May 2007, 190504-1-190504-4.
Rivest et al., "A method for obtaining digital signatures and public-key cryptosystems," Communications of the ACM, Feb. 1978, 21(2):120-126.
Roetteler et al., "Quantum Resource Estimates for Computing Elliptic Curve Discrete Logarithms," Proceedings of the 23rd International Conference on the Theory and Application of Cryptology and Information Security: Advances in Cryptology (ASIACRYPT 2017), Lecture Notes in Computer Science (LNCS), Nov. 2017, 10625:241-270.
Schirokauer, "Discrete Logarithms and Local Units," Philosophical Transactions of the Royal Society A, Nov. 1993, 345(1676):409-423.
Schonhage et al., "Schnelle Multiplikation großer Zahlen," Computing 7, Sep. 1971, 281-292 (with English summary).
Schroeder et al., "DRAM Errors in the Wild: A Large-Scale Field Study," ACM SIGMETRICS Performance Evaluation Review, Jun. 2009, 37, 193-204.
Shor, "Algorithms for quantum computation: Discrete logarithms and factoring," Proceedings 35th Annual Symposium on Foundations of Computer Science, Nov. 1994, 124-134.

(56) References Cited

OTHER PUBLICATIONS

Smartcardfocus.com [online], "JavaCOS A22 dual interface Java card—150K," available on or before Dec. 18, 2016, via Internet Archive: Wayback Machine URL <https://web.archive.org/web/20161218155914/http://www.smartcardfocus.com/shop/ilp/id~712/javacos-a22-dual-interface-java-card-150k/p/index.shtml>, retrieved on Jun. 29, 2020, URL <https://www.smartcardfocus.com/shop/ilp/id~712/javacos-a22-dual-interface-java-card-150k/p/index.shtml>, 1 page.

Van Meter et al., "Fast quantum modular exponentiation," Physical Review A, May 2005, 71:052320-1-052320-12.

van Oorschot et al., "On Diffie-Hellman Key Agreement with Short Exponents," Proceedings of the International Conference on the Theory and Applications of Cryptographic Techniques, Advanced in Ciyptology (EUROCRYPT 1996), 1996, 1070:332-343.

Vedral et al., "Quantum networks for elementary arithmetic operations," Physical Review A, Jul. 1996, 147-153.

Wikipedia.org [online], "Timeline of quantum computing," available on or before Nov. 19, 2018, via Internet Archive: Wayback Machine URL <https://web.archive.org/web/20181119015658/https://en.wikipedia.org/wiki/Timeline_of_quantum_computing>, retrieved on Jun. 30, 2020, URL <https://en.wikipedia.org/wiki/Timeline_of_quantum_computing>, 13 pages.

Zalka, "Fast versions of Shor's quantum factoring algorithm," https://arxiv.org/abs/quant-ph/9806084, Jun. 1998, 37 pages.

Zalka, "Shor's algorithm with fewer (pure) qubits," https://arxiv.org/abs/quant-ph/0601097, Jan. 2006, 12 pages.

International Preliminary Report on Patentability in International Appln. No. PCT/US2020/025445, dated Oct. 14, 2021, 17 pages.

Office Action in Australian Appln. No. 2020256115, dated Jun. 27, 2022, 5 pages.

EP Office Action in European Appln. No. 20721929.6, dated Oct. 5, 2022, 9 pages.

Office Action in Canadian Appln. No. 3135491, dated Jan. 3, 2023, 6 pages.

\* cited by examiner

300

Determine entries of a lookup table by multiplying, for each index value in a first set of indices, the index value by the scalar product addition    _302_

For each index in a second set of indices:

Determine multiple address values by extracting source quantum register values between the index and the index plus window size    _304_

Adjust target quantum register based on determined entries of lookup table and address values    _306_

```
402  { def plus_equal_product(target: Quint,
                              k: int,
                              y: Quint,
                              window: int):
404  {  table = LookupTable([
            i*k
            for i in range(2**window)
        ])
406  {  for i in range(0, len(y), window):
            target[i:] += table[y[i:i+window]]
```

FIG. 4

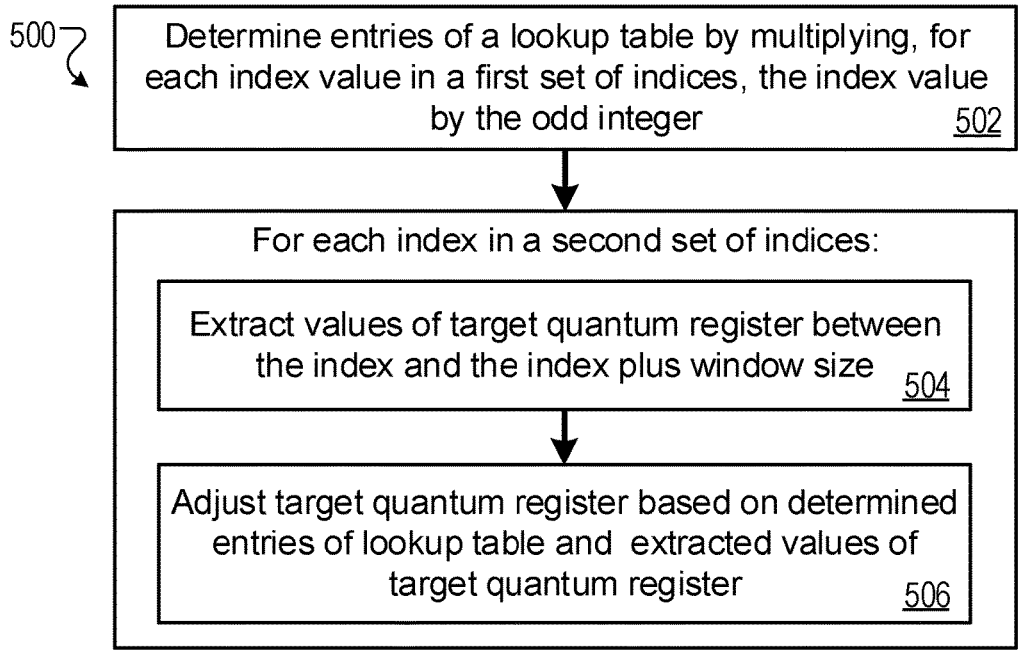

500 → Determine entries of a lookup table by multiplying, for each index value in a first set of indices, the index value by the odd integer   502

For each index in a second set of indices:

Extract values of target quantum register between the index and the index plus window size   504

Adjust target quantum register based on determined entries of lookup table and extracted values of target quantum register   506

```
602 {  def times_equal ( target : Quint , k : int , window : int ) :
          assert k % 2 == 1   #  Even factors aren't reversible .
604 {     k %= 2**len ( target )   # Normalize factor .
          if  k==1 :
              return
          table  = LookupTable ( [
              ( j * k ) >> window
606 {         for  j  in range (2**window)
          ])
          for i  in range ( 0 , len ( target ) , window ) |[ : : -1] :
              w = target [ i : i + window ]
608 {         target [ i + window : ] +=  table [ w ]
              # Recursively fix up the window .
610 {         times_equal ( w , k , window = 1)
```

For each index in a first set of indices:

Extract values of source quantum register between the index and the index plus window size
702

Determine multiple table entries for each index in a second set of indices
704

Adjust values of target quantum register using extracted values and determined table entries
706

```
802  def plus_equal_product_mod(target: QuintMod,
                                k: int,
                                y: Quint,
                                window: int):
804  N = target.modulus
     for i in range(0, len(y), window):
         w = y[i:i + window]
806      table = LookupTable([
             j * k * 2**i % N
             for j in range(2**window)
         ])
808      target += table[w]
```

FIG. 8

```
def times_equal_exp_mod ( target : QuintMod ,
                         k : int ,
                         e : Quint ,
                         e_window : int ,
                         m_window : int ) :
    """ Performs 'target *= k**e', modulo the target's modulus. """
    N = target.modulus
    ki = modular_multiplicative_inverse ( k, N )
    assert ki is not None a = target
    b = qalloc_int_mod ( modulus = N )

for i in range (0, len ( e ), e_window ) :
        ei = e [ i : i + e_window ]

# Exponent - indexed factors and inverse factors .
        kes = [ pow ( k , 2**i * x , N )
                for x in range ( 2**e_window ) ]
        kes_inv = [ modular_multiplicative_inverse ( x , N )
                    for x in kes ]

# Perform b += a * k_e ( mod modulus ) .
        # Maps ( x , 0 ) into ( x , x*k_e ) .
        for j in range ( 0 , len ( a ) , m_window ) :
            mi = a [ j : j + m_window ]
            table = LookupTable (
                [ ( ke * f * 2**j ) % N
                  for f in range ( 2 ** len ( mi ) ) ]
                for ke in kes )
            b += table [ ei , mi ]

# Perform a -= b * inv ( k_e ) ( mod modulus ) .
        # Maps ( x , x*k_e ) into ( 0 , x*k_e ) .
        for j in range ( 0 , len ( a ) , m_window ) :
            mi = b [ j : j + m_window ]
            table = LookupTable (
                [ ( ke_inv * f * 2 **j ) % N
                  for f in range ( 2 ** len ( mi ) ) ]
                for ke_inv in kes_inv )
            a -= table [ ei , mi ]

# Relabelling swap. Maps ( 0 , x*k_e ) into ( x*k_e , 0 ) .
        a , b = b , a

# Xor swap result into correct register if needed .
    if a is not target :
        swap ( a , b )
        a , b = b , a
    qfree ( b )
```

FIG. 10

QUANTUM CIRCUIT OPTIMIZATION USING WINDOWED QUANTUM ARITHMETIC

CROSS-REFERENCE TO RELATED APPLICATION

This application claims priority under 35 U.S.C. 119 to Provisional Application No. 62/826,142, filed Mar. 29, 2019, which is incorporated by reference.

BACKGROUND

This specification relates to quantum computing.

Classical computers have memories made up of bits, where each bit can represent either a zero or a one. Quantum computers maintain sequences of quantum bits, called qubits, where each quantum bit can represent a zero, one or any quantum superposition of zeros and ones. Quantum computers operate by setting qubits in an initial state and controlling the qubits, e.g., according to a sequence of quantum logic gates.

SUMMARY

This specification describes techniques for accelerating quantum computations using windowed quantum arithmetic.

In general, one innovative aspect of the subject matter described in this specification can be implemented in a method for performing a product addition operation on a target quantum register of qubits and a source quantum register of qubits, the method comprising: determining multiple entries of a lookup table, comprising, for each index in a first set of indices, wherein the first set of indices comprises index values between zero and a maximum index value that is a function of a predetermined window size, multiplying the index value by a scalar for the product addition operation; for each index in a second set of indices, wherein the second set of indices comprises index values between zero and a maximum index value that is a function of the source quantum register, wherein the index values are stepped by the predetermined window size: determining multiple address values, comprising extracting source register values corresponding to indices between i) the index in the second set of indices, and ii) the index in the second set of indices plus the predetermined window size; and adjusting values of the target quantum register based on the determined multiple entries of the lookup table and the determined multiple address values.

Other implementations of these aspects includes corresponding computer systems, apparatus, and computer programs recorded on one or more computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the maximum index value that is a function of the predetermined window size is equal to 2 to the power of the predetermined window size.

In some implementations the maximum index value that is a function of the source quantum register is equal to the length of the source register.

In some implementations the predetermined window size comprises ln n, where n represents a number of logical qubits in the target quantum register.

In some implementations adjusting values of the target quantum register based on the determined multiple entries of the lookup table and the determined multiple address values comprises adding the determined multiple entries into the target quantum register.

In some implementations the product addition operation performs x+=ky, where x represents a variable storing a first value in the target quantum register, y represents a corresponding variable storing a second value in the source quantum register, k represents a classical constant scalar value for the product addition operation.

In some implementations the target quantum register comprises a fixed width 2s complement register.

In some implementations the first value comprises a classical integer or a superposition of classical integers.

In some implementations the second value comprises a classical integer or a superposition of classical integers.

In general, another innovative aspect of the subject matter described in this specification can be implemented in a method for performing a modular product addition operation using a target quantum register of qubits and a source quantum register of qubits, the method comprising: for each index in a first set of indices, wherein the first set of indices comprises index values between zero and a maximum index value that is a function of the source quantum register, wherein the index values are stepped by a predetermined window size: determining multiple address values, comprising extracting source register values corresponding to indices between i) the index in the first set of indices, and ii) the index in the first set of indices plus the predetermined window size; determining multiple corresponding table entries, comprising, for each index in a second set of indices, wherein the second set of indices comprises index values between zero and a maximum table index that is a function of the predetermined window size: determining a table entry comprising a product of i) a scalar in the product addition operation, ii) 2 to the power of the index in the first set of indices, and iii) the index in the second set of indices, and applying a modulus operation to the determined table entry; and adjusting values of the target quantum register based on the determined multiple table entries and the determined multiple address values.

Other implementations of these aspects includes corresponding computer systems, apparatus, and computer programs recorded on one or more computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the maximum index value that is a function of the source quantum register is equal to the length of the source quantum register.

In some implementations the maximum table index that is a function of the predetermined window size is equal to 2 to the power of the predetermined window size.

In some implementations the modular product addition operation performs x+=ky (mod N), where x represents a variable storing a first value in the target quantum register, y represents a corresponding variable storing a second value in the source quantum register, k represents a classical constant scalar value for the modular product addition operation, and N represent a classical constant modulo for the modular product addition operation.

In some implementations values of x, y and k are positive and less than N.

In some implementations the first value comprises a classical integer or a superposition of classical integers.

In some implementations the second value comprises a classical integer or a superposition of classical integers.

In some implementations the predetermined window size comprises ln n, where n represents a number of logical qubits in the target quantum register.

In some implementations adjusting values of the target quantum register based on the determined multiple table entries and the determined multiple address values comprises adding the determined multiple table entries into the target quantum register.

In some implementations the method further comprises performing a series of modular product addition operations to perform a modular multiplication operation.

In general, another innovative aspect of the subject matter described in this specification can be implemented in a method for multiplying values of a target quantum register of qubits by an odd integer, the method comprising: determining multiple lookup table entries, comprising, for each index in a first set of indices, wherein the first set of indices comprises index values between zero and a maximum table index that is a function of a predetermined window size: determining a product of the index in the first set of indices and the odd integer; for each index in a second set of indices, wherein the second set of indices comprises index values from a maximum index value that is a function of the target quantum register to zero, wherein the index values are stepped by a predetermined window size: extracting multiple values of the target quantum register between the index in the second set of indices to the index in the second set of indices plus the predetermined window size; and adjusting multiple values of the target quantum register based on the determined multiple lookup table entries and the extracted multiple values of the target quantum register, wherein the multiple values of the target quantum register comprise values between the index in the second set of indices plus the predetermined window size and an end of the target quantum register.

Other implementations of these aspects includes corresponding computer systems, apparatus, and computer programs recorded on one or more computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the maximum table index that is a function of the predetermined window size is equal to 2 to the power of the predetermined window size.

In some implementations the maximum index value that is a function of the target quantum register is equal to the length of the target quantum register.

In some implementations multiplying values of a target quantum register of qubits by an odd integer comprises performing x*=k, where x represents a variable storing a first value in the target quantum register and k represents the odd integer.

In some implementations the first value comprises a classical integer or a superposition of classical integers.

In some implementations the predetermined window size comprises ln n, where n represents a number of logical qubits in the target quantum register.

In some implementations adjusting multiple values of the target quantum register based on the determined multiple lookup table entries and the extracted multiple values of the target quantum register comprises adding the determined multiple lookup table entries into the target quantum register.

In general, another innovative aspect of the subject matter described in this specification can be implemented in a method for method for performing a modular exponentiation operation using a target quantum register of qubits and a source quantum register of qubits, the method comprising: for each index in a first set of indices, determining a first plurality of address values, comprising extracting multiple source register values; for each index in a second set of indices, determining a second plurality of address values, comprising extracting multiple target register values; for each index in a third set of indices and for each index in a fourth set of indices, determining a table entry by multiplying i) the index in the third set of indices, ii) the index in the fourth set of indices, and iii) 2 to the power of the index in the second set of indices, and applying a modulus operation; adjusting a modular addition register using table entries corresponding to the first plurality of address values and the second plurality of address values; for each index in a fifth set of indices, determining a third plurality of address values, comprising extracting multiple values of the adjusted modular addition register; for each index in a sixth set of indices, for each index in a seventh set of indices, determining a table entry by multiplying i) the index in the sixth set of indices, ii) the index in the seventh set of indices, and iii) 2 to the power of the index in the fifth set of indices, and applying a modulus operation; and adjusting the target quantum register using table entries corresponding to the first plurality of address values and the third plurality of address values.

Other implementations of these aspects includes corresponding computer systems, apparatus, and computer programs recorded on one or more computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the first set of indices comprises index values between zero and a first maximum index value that is a function of the source quantum register, wherein the index values are stepped by a first predetermined window size.

In some implementations the set of indices comprises index values between zero and a second maximum index value that is a function of the target register, wherein the index values are stepped by a second predetermined window size.

In some implementations the third set of indices comprises index values between 1 and a third maximum value that is based on the first predetermined window size.

In some implementations the fourth set of indices comprises index values between 0 and a fourth maximum value that is a function of the target quantum register and the second predetermined window size.

In some implementations the fifth set of indices comprises index values between zero and a fifth maximum index value that is a function of the target register, wherein the index values are stepped by the second predetermined window size.

In some implementations the sixth set of indices comprises index values between 1 and a sixth value that is based on the second predetermined window size.

In some implementations the seventh set of indices comprises index values between 0 and a seventh maximum value that is a function of the modular addition register and the second predetermined window size.

In some implementations determining the first plurality of address values comprises extracting source register values corresponding to indices between i) the index in the first set of indices, and ii) the index in the first set of indices plus the first predetermined window size.

In some implementations determining the second plurality of address values comprises extracting target register values corresponding to indices between i) the index in the second set of indices, and ii) the index in the second set of indices plus the second predetermined window size.

In some implementations determining the third plurality of address values comprises extracting values of the adjusted modular addition register corresponding to indices between i) the index in the fifth set of indices, and ii) the index in the fifth set of indices plus the second predetermined window size.

In some implementations the first maximum index value that is a function of the source quantum register is equal to the length of the source quantum register.

In some implementations the second maximum index value that is a function of the target register is equal to the length of the target quantum register.

In some implementations the third maximum value that is based on the first predetermined window size comprises $k^{2i+w_1}$ where k represents a scalar for the modular exponentiation operation, i represents the index in the first set of indices, and $w_1$ represents the first predetermined window size.

In some implementations the fourth maximum value that is a function of the target quantum register and the second predetermined window size comprises 2 to the power of the second window size.

In some implementations the fifth maximum index value that is a function of the target register is equal to the length of the target quantum register.

In some implementations the seventh maximum value that is a function of the target quantum register and the second predetermined window size comprises 2 to the power of the second window size.

In some implementations the modular exponentiation operation performs $x^*=k^e$ (mod N), where x represents a variable storing a first value in the target quantum register, e represents a corresponding variable storing a second value in the source quantum register, k represents a classical constant scalar value for the modular exponentiation operation, and N represent a classical constant modulo for the modular exponentiation operation.

In some implementations the first value comprises a classical integer or a superposition of classical integers.

In some implementations the second value comprises a classical integer or a superposition of classical integers.

In some implementations the first predetermined window size and the second window size are equal.

In some implementations the first predetermined window size and second predetermined window size are equal to ln n/2, where n represents a number of logical qubits in the target quantum register.

The subject matter described in this specification can be implemented in particular ways so as to realize one or more of the following advantages.

A system implementing the presently described windowing techniques can perform quantum arithmetic tasks, e.g., product additions, multiplications and exponentiations, with lower Toffoli complexity and increased computational speed.

The presently described windowing techniques can be applied in any quantum computation that involves arithmetic operations. Because of the above described increased computational speed and reduced Toffoli count, quantum computations implementing the presently described techniques can therefore also achieve increased computational speed and a reduction in costs/computational resources.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 3 is a flow diagram of an example process for performing a product addition operation on a target quantum register of qubits and a source quantum register of qubits.

FIG. 4 shows a snippet of executable python 3 code for performing a product addition operation on a target quantum register of qubits and a source quantum register of qubits.

FIG. 5 is a flow diagram of an example process for multiplying values of a target quantum register of qubits by an odd integer.

FIG. 6 shows a snippet of executable python 3 code for multiplying values of a target quantum register of qubits by an odd integer.

FIG. 7 is a flow diagram of an example process for performing a modular product addition operation using a target quantum register of qubits and a source quantum register of qubits.

FIG. 8 shows a snippet of executable python 3 code for performing a modular product addition operation.

FIG. 10 shows a snippet of executable python 3 code for performing a modular exponentiation operation.

Like reference numbers and designations in the various drawings indicate like elements.

DETAILED DESCRIPTION

Overview

In classical computing, operation counts can be reduced by merging operations together using lookup tables. For example, fast software implementations of cyclic redundancy check parity check codes process multiple bits at a time using precomputed tables. These techniques are known as "windowing."

This specification describes windowing in quantum computing. In particular, techniques for reducing operation counts in quantum computing by merging multiple controlled operations into a single operation acting on a value produced by a QROM (quantum read only memory) lookup (referred to herein as a "table lookup") are described.

Figure 1:
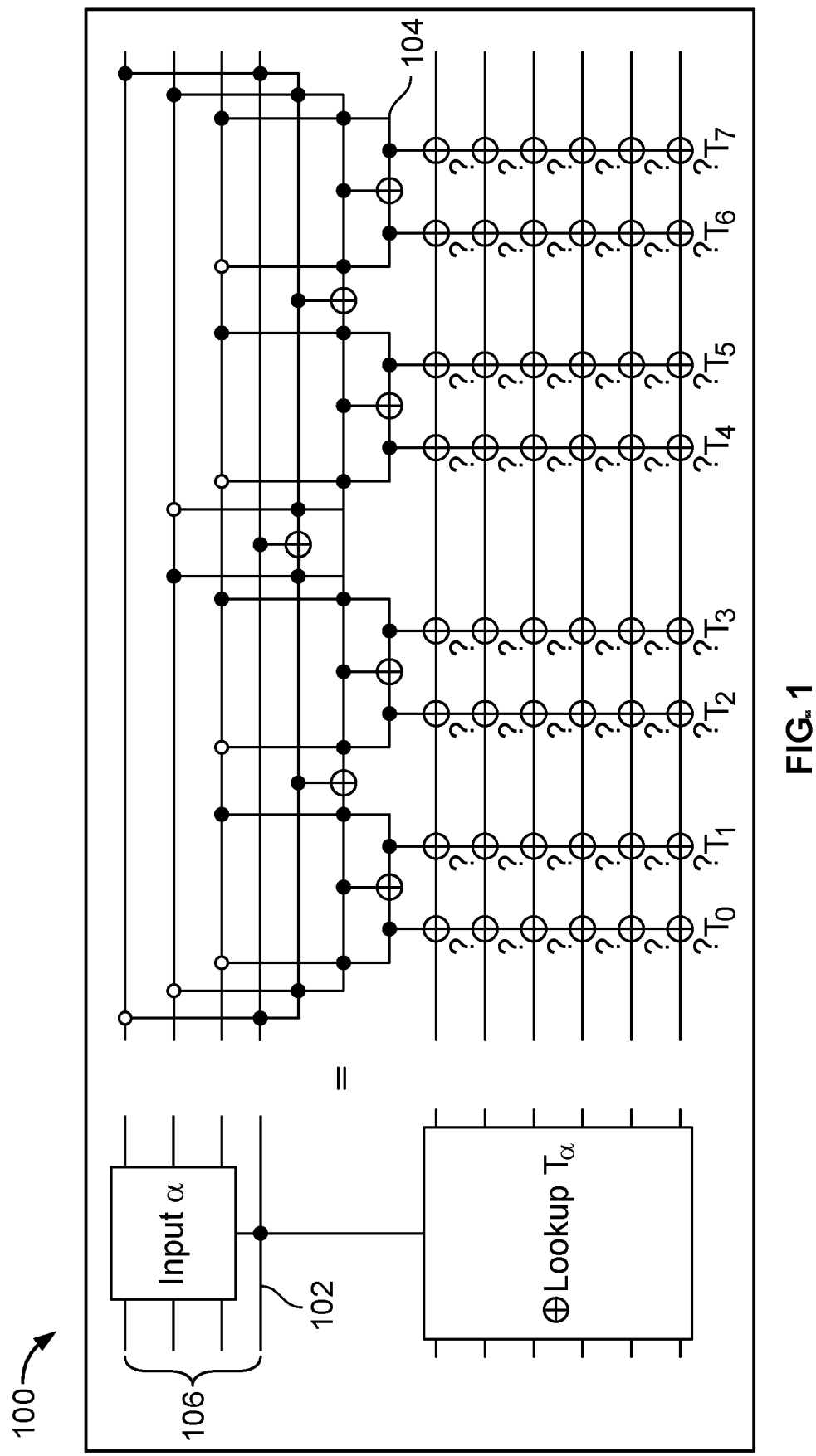
FIG. 1 shows an example quantum circuit for performing a table lookup.

A table lookup is an operation that retrieves data from a classical table addressed by a quantum register. It performs the operation $\Sigma_{j=0}^{L-1}|j\rangle|0\rangle \mapsto \Sigma_{j=0}^{L-1}|j\rangle|T_j\rangle$ where T represents a classically precomputed table with L entries. FIG. 1 is a quantum circuit diagram of an example quantum circuit 100 for performing a table lookup with a Toffoli count of L−1 (independent of the number of bits in each entry.) In FIG. 1, the perpendicular lines merging from and merging into other lines to form corners, e.g., merging lines 104, are AND computations and uncomputations, respectively, and are equivalent to Toffoli gates. If the control qubit 102 is set and the address register 106 contains the binary value a, the example quantum circuit 100 xors the a-th bit string from a precomputed lookup table T into W output qubits. In the example quantum circuit 100, L=23 and W=6. The question marks beside the CNOT targets indicate that the target should be omitted or included depending on a corresponding bit in T. Using known techniques (e.g., techniques different to those described in this specification), it is possible to compute a table lookup in O(WL/k+k) Toffolis, where W represents the output size of the lookup and k represents a freely chosen parameter.

Example Hardware

Figure 2:
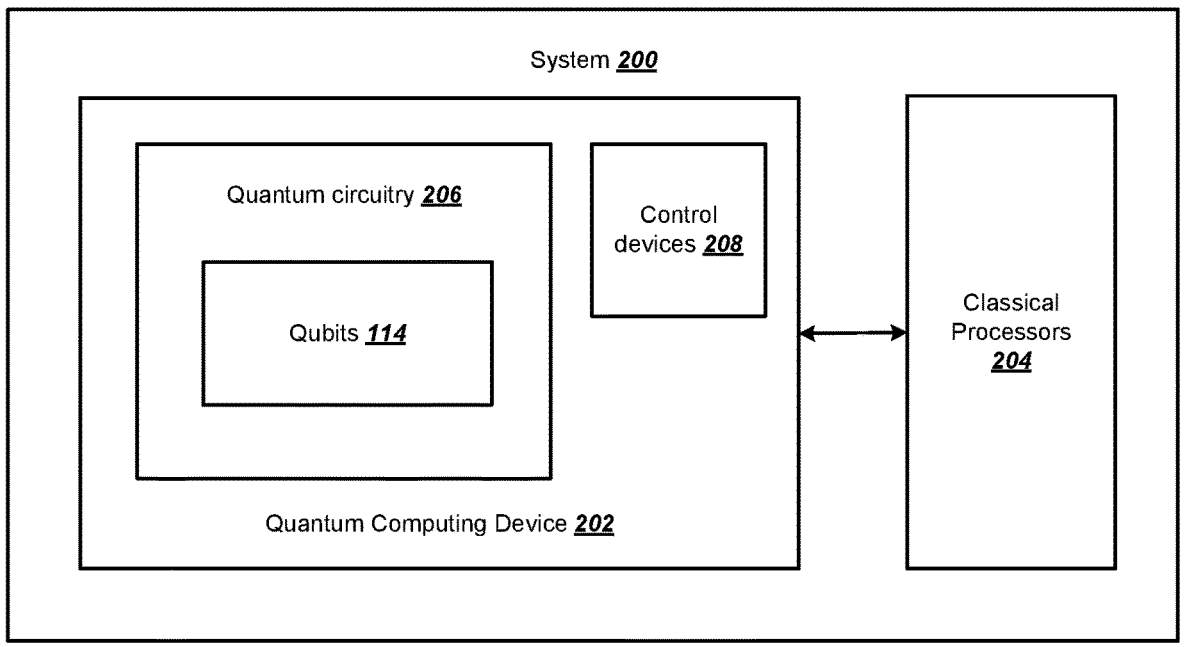
FIG. 2 shows an example quantum computation system.

FIG. 2 depicts an example quantum computation system 200. The system 200 is an example of a system implemented as quantum and classical computer programs on one or more quantum computing devices and classical computers in one or more locations, in which the systems, components, and techniques described below can be implemented.

The system 200 includes a quantum computing device 202 in data communication with one or more classical processors 204. For convenience, the quantum computing device 202 and classical processors 204 are illustrated as separate entities, however in some implementations the classical processors 204 may be included in the quantum computing device 202.

The quantum computing device 202 includes components for performing quantum computation. For example, the quantum computing device 202 includes quantum circuitry 206 and control devices 208.

The quantum circuitry 206 includes components for performing quantum computations, e.g., components for implementing the various quantum circuits and operations described in this specification. For example, the quantum circuitry may include a quantum system that includes one or more multi-level quantum subsystems, e.g., qubits 214. The qubits 214 are physical qubits that may be used to perform algorithmic operations or quantum computations. The specific realization of the one or more qubits and their interactions may depend on a variety of factors including the type of quantum computations that the quantum computing device 202 is performing. For example, the qubits may include qubits that are realized via atomic, molecular or solid-state quantum systems. In other examples the qubits may include, but are not limited to, superconducting qubits, e.g., Gmon or Xmon qubits, or semi-conducting qubits. Further examples of realizations of multi-level quantum subsystems include fluxmon qubits, silicon quantum dots or phosphorus impurity qubits. In some cases the quantum circuitry may further include one or more resonators attached to one or more superconducting qubits. In other cases ion traps, photonic devices or superconducting cavities (with which states may be prepared without requiring qubits) may be used.

In this specification, the term "quantum circuit" is used to refer to a sequence of quantum logic operations that can be applied to a qubit register to perform a respective computation. Quantum circuits comprising different quantum logic operations, e.g., single qubit gates, multi-qubit gates, etc., may be constructed using the quantum circuitry 206. Constructed quantum circuits can be operated/implemented using the control devices 208.

The type of control devices 208 included in the quantum system depend on the type of qubits included in the quantum computing device. For example, in some cases the multiple qubits can be frequency tunable. That is, each qubit may have associated operating frequencies that can be adjusted using one or more control devices. Example operating frequencies include qubit idling frequencies, qubit interaction frequencies, and qubit readout frequencies. Different frequencies correspond to different operations that the qubit can perform. For example, setting the operating frequency to a corresponding idling frequency may put the qubit into a state where it does not strongly interact with other qubits, and where it may be used to perform single-qubit operations/gates. In these examples the control devices 208 may include devices that control the frequencies of qubits included in the quantum circuitry 206, an excitation pulse generator and control lines that couple the qubits to the excitation pulse generator. The control devices may then cause the frequency of each qubit to be adjusted towards or away from a quantum gate frequency of an excitation pulse on a corresponding control driveline.

The control devices 208 may further include measurement devices, e.g., readout resonators. Measurement results obtained via measurement devices may be provided to the classical processors 204 for processing and analyzing. Measurement devices perform physical measurements on properties of the qubits, either directly or indirectly, from which the state(s) of the qubits can be inferred.

Programming the Hardware: Example Process for Performing Product Addition Operations FIG. 3 is a flow diagram of an example process 300 for performing a product addition operation on a target quantum register of qubits and a source quantum register of qubits. For convenience, the process 300 will be described as being performed by a system of one or more classical and quantum computing devices located in one or more locations. For example, a quantum computation system, e.g., the system 200 of FIG. 2, appropriately programmed in accordance with this specification, can perform the process 300.

The product addition operation performed by example process 300 can be given by x=x+ky (or equivalently x+=ky), where x represents a variable storing a first value in the target quantum register, y represents a corresponding variable storing a second value in the source quantum register, and k represents a (classical) constant scalar value for the product addition operation. The first value and second value are quantum integers. In this specification, a quantum integer refers to a classical integer or a superposition of classical integers stored by a quantum register, e.g., as a sequence of qubits using 2s complement little endian format.

The system determines multiple entries of a lookup table (step 302). For each index in a first set of indices, where the first set of indices includes index values between zero and a maximum index value that is a function of a predetermined window size, the system multiplies the index value by a scalar for the product addition operation. The maximum index value that is a function of the predetermined window size can be equal to 2 to the power of the predetermined window size.

In some implementations the system can determine the entries of the lookup table using classical computation, e.g., classically performed multiplications. The lookup table defined by the determined entries can then be stored in classical memory of the system.

For each index in a second set of indices, the system determines multiple address values (step 304) and adjusts values of the target quantum register based on the determined multiple entries of the lookup table and the determined multiple address values (step 306). The second set of indices includes index values between zero and a maximum index value that is a function of the source quantum register and where the index values are stepped by the predetermined window size. The maximum index value that is a function of the source quantum register can be equal to the length of the source quantum register.

To determine the multiple address values, the system extracts source quantum register values corresponding to indices between i) the index in the second set of indices, and ii) the index in the second set of indices plus the predetermined window size. The system sets the multiple address values equal to respective extracted source quantum register values. Extracting the source quantum register values is a quantum computation performed by quantum computing devices based on quantum unitary operations/quantum gates (excluding measurements).

To adjust values of the target quantum register based on the determined multiple entries of the lookup table and the determined multiple address values, the system identifies table entries (determined at step 302) that correspond to the address values (determined at step 304). In some implementations the system may store the identified table entries in a temporary quantum register. The system uses the identified table entries to adjust a subset of entries of the target quantum register. The subset of entries correspond to entries including and after the current index from the second set of indices. To adjust the subset of entries of the target quantum register, the system adds the identified table entries into the target quantum register. For example, the system can perform a quantum addition computation using quantum computing devices, e.g., by applying a quantum addition circuit to the target quantum register and the temporary quantum register. The quantum addition circuit may include a sequence of quantum logic gates that implement an addition operation.

The windowed implementation of product addition described by example process 300 has an asymptotic Toffoli count of $$O\left(\frac{n}{w}(n+2^w)\right)$$

where w represents the predetermined window size. In some implementations the predetermined window size can equal ln n, where n represents a number of logical qubits in the target quantum register. In these implementations the table lookup is as expensive as the addition, achieves a Toffoli count of $O(n^2/\lg n)$.

FIG. 4 shows a snippet 400 of executable python 3 code for performing a product addition operation on a target quantum register of qubits and a source quantum register of qubits. In the code snippets described in this specification, quantum operations are specified in the same way as classical operations. The code interpreter must then decompose high level quantum arithmetic into corresponding low level quantum operations. For example, when a, b are variables holding quantum integers, the statement a+=b applies a quantum addition circuit to a and b. If b is a classical integer, then b is treated as a temporary expression (an rvalue) that must be loaded into a quantum register so that a quantum addition circuit using the classical integer can be applied. There are other kinds of rvalues that can be temporarily loaded into a register in order to add them into a target. For example, indexing a lookup table with a quantum integer produces a lookup rvalue and so the statement a+=T[b] results in the following three actions: compute a table lookup with classical data T and quantum address b into a temporary register, then add the temporary register into a, then uncompute the table lookup.

Section 402 of the snippet 400 defines the product addition operation "plus_equal_product", where "target" represents the target quantum register, "Quint" represents a quantum integer, "k" represents the constant scalar value for the product addition operation, "int" represents a classical integer, "y" represents the source quantum register, "window" represents the predetermined window size.

Section 404 of the snippet 400 corresponds to step 302 of example process 300. For each index i in a first set of indices that ranges from zero to $2^{window}$, a respective table entry value i*k is computed. Section 406 of the snippet 400 corresponds to step 304 of example process 300. For each index i in a second set of indices that ranges from 0 to the length of the source quantum register len(y) stepped by the window size, values within a corresponding segment of the target register are adjusted based on values in a corresponding set of the computed table entries, where the size of the set equals the predetermined window size.

Programming the Hardware: Example Process for Performing Multiplication Operations FIG. 5 is a flow diagram of an example process 500 for multiplying values of a target quantum register of qubits by an odd integer. For convenience, the process 500 will be described as being performed by a system of one or more classical and quantum computing devices located in one or more locations. For example, a quantum computation system, e.g., the system 200 of FIG. 2, appropriately programmed in accordance with this specification, can perform the process 500.

The multiplication operation performed by example process 500 can be given by x*=k, where x represents a variable storing a first value in the target quantum register and k represents an odd integer. The first value is a quantum integer, as defined above with reference to example process 300.

The system determines multiple entries of a lookup table (step 502). For each index in a first set of indices, where the first set of indices includes index values between zero and a maximum table index that is a function of a predetermined window size, the system determines a product of the index in the first set of indices and the odd integer. The maximum table index that is a function of the predetermined window size can equal to 2 to the power of the predetermined window size.

In some implementations the system can determine the entries of the lookup table using classical computation, e.g., classically performed multiplications. The lookup table defined by the determined entries can then be stored in classical memory of the system.

For each index in a second set of indices, the system extracts multiple values of the target quantum register (step 504) and adjusts multiple values of the target quantum register based on the determined multiple lookup table entries and the extracted multiple values of the target quantum register (step 506). The second set of indices includes index values from a maximum index value that is a function of the target quantum register to zero, where the index values are stepped by a predetermined window size. The maximum index value that is a function of the target quantum register can equal to the length of the target quantum register.

To extract multiple values of the target quantum register, the system extracts values between the index in the second set of indices to the index in the second set of indices plus the predetermined window size. Extracting the target quantum register values is a quantum computation performed by quantum computing devices.

To adjust values of the target quantum register based on the determined multiple entries of the lookup table and the extracted multiple address values, the system identifies table entries (determined at step 502) that correspond to the address values (determined at step 504). In some implementations the system may store the identified table entries in a temporary quantum register. The system uses the identified table entries to adjust a subset of entries of the target quantum register. The subset of entries correspond to entries including and after the current index from the second set of indices plus the window size. To adjust the subset of entries of the target quantum register, the system adds the identified table entries into the target quantum register. For example, the system can perform a quantum addition computation using quantum computing devices, e.g., by applying a quantum addition circuit to the target quantum register and the temporary quantum register. The quantum addition circuit may include a sequence of quantum logic gates that implement an addition operation.

The windowed multiplication described by example process 500 has Toffoli count of $$O\left(\frac{n}{w} \cdot (n + 2^w + w^2)\right)$$

where w represents the predetermined window size. In some implementations the predetermined window size can equal ln n, where n represents a number of logical qubits in the target quantum register. In these implementations the Toffoli count is $O(n^2/\lg n)$.

FIG. 6 shows a snippet 600 of executable python 3 code for multiplying values of a target quantum register of qubits by an odd integer.

Section 602 of the snippet 600 defines the multiplication operation. As in snippet 400, "target" represents the target quantum register, "Quint" represents a quantum integer, "k" represents a constant scalar value for the multiplication operation, "int" represents a classical integer, and "window" represents the predetermined window size.

Section 604 of the snippet 600 defines an optional routine for normalizing the scalar value k. Section 606 of the snippet 600 corresponds to step 502 of example process 500. Section 608 of the snippet 600 corresponds to steps 504 and 506 of example process 500. Section 610 of the snippet 600 defines a routine for fixing up the window, e.g., to complete the multiplication operation for all target register entries previously not operated on during section 608.

Programming the Hardware: Example Process for Performing Modular Product Additions FIG. 7 is a flow diagram of an example process 700 for performing a modular product addition operation using a target quantum register of qubits and a source quantum register of qubits. For convenience, the process 700 will be described as being performed by a system of one or more classical and quantum computing devices located in one or more locations. For example, a quantum computation system, e.g., the system 200 of FIG. 2, appropriately programmed in accordance with this specification, can perform the process 700.

The modular product addition operation performed by example process 700 can be given by x+=ky (mod N), where x represents a variable storing a first value in the target quantum register, y represents a corresponding variable storing a second value in the source quantum register, k represents a classical constant scalar value for the modular product addition operation, and N represent a classical constant modulo for the modular product addition operation. In some implementations values of x, y and k are positive and less than N. As described above with reference to FIG. 3, the first value and the second value can be quantum integers.

For each index in a first set of indices, the system determines multiple address values (step 702) and determines multiple table entries (step 704). The first set of indices includes index values between zero and a maximum index value that is a function of the source quantum register, where the index values are stepped by a predetermined window size. The maximum index value that is a function of the source quantum register can be equal to the length of the source quantum register.

To determine the multiple address values, the system extracts source quantum register values corresponding to indices between i) the index in the first set of indices, and ii) the index in the first set of indices plus the predetermined window size. The system sets the multiple address values as equal to respective extracted source quantum register values. Extracting the source quantum register values is a quantum computation performed by quantum computing devices.

To determine the multiple table entries, the system determines, for each index in a second set of indices, a table entry given by a product of i) a scalar in the product addition operation, ii) 2 to the power of the index in the first set of indices, and iii) the index in the second set of indices, then applies a modulus operation corresponding to the modular product addition operation to the determined table entry. The second set of indices includes index values between zero and a maximum table index that is a function of the predetermined window size, e.g., 2 to the power of the predetermined window size. In some implementations the system can determine the entries of the table using classical computation, e.g., classically performed multiplications. The table defined by the determined entries can then be stored in classical memory of the system.

The system then adjusts values of the target quantum register based on the determined multiple table entries and the determined multiple address values (step 706), e.g., using table entries corresponding to the determined address values. In some implementations the system may store the table entries corresponding to the determined address values in a temporary quantum register. The system uses the table entries to adjust entries of the target quantum register. To adjust the entries of the target quantum register, the system adds the determined table entries into the target quantum register. For example, the system can perform a quantum addition computation using quantum computing devices, e.g., by applying a quantum addition circuit to the target quantum register and the temporary quantum register. The quantum addition circuit may include a sequence of quantum logic gates that implement an addition operation.

The windowed modular product addition described by example process 700 has Toffoli count of $$O\left(\frac{n}{w}(n+2^w)\right)$$

where w represents the predetermined window size. In some implementations the predetermined window size can equal ln n, where n represents a number of logical qubits in the target quantum register. In these implementations the Toffoli count is $O(n^2/\ln n)$.

A series of modular product additions can be performed to perform a modular multiplication operation x*=k (mod N) where k has a multiplicative inverse modulo N and both are classical constants.

FIG. 8 shows a snippet 800 of executable python 3 code for performing a modular product addition operation. Section 802 of the snippet 800 defines the modular product addition operation "plus_equal_product_mod", where "target" represents the target quantum register, "Quint" represents a quantum integer, "QuintMod" represents a quantum integer associated with a modulus, "k" represents the constant scalar value for the modular product addition operation, "int" represents a classical integer, "y" represents the source quantum register, and "window" represents the predetermined window size.

Section 804 of the snippet 800 corresponds to step 702 of example process 700. Section 806 of snippet 800 corresponds to step 704 of example process 700. Section 808 of snippet 800 corresponds to step 706 of example process 700.

Figure 9:
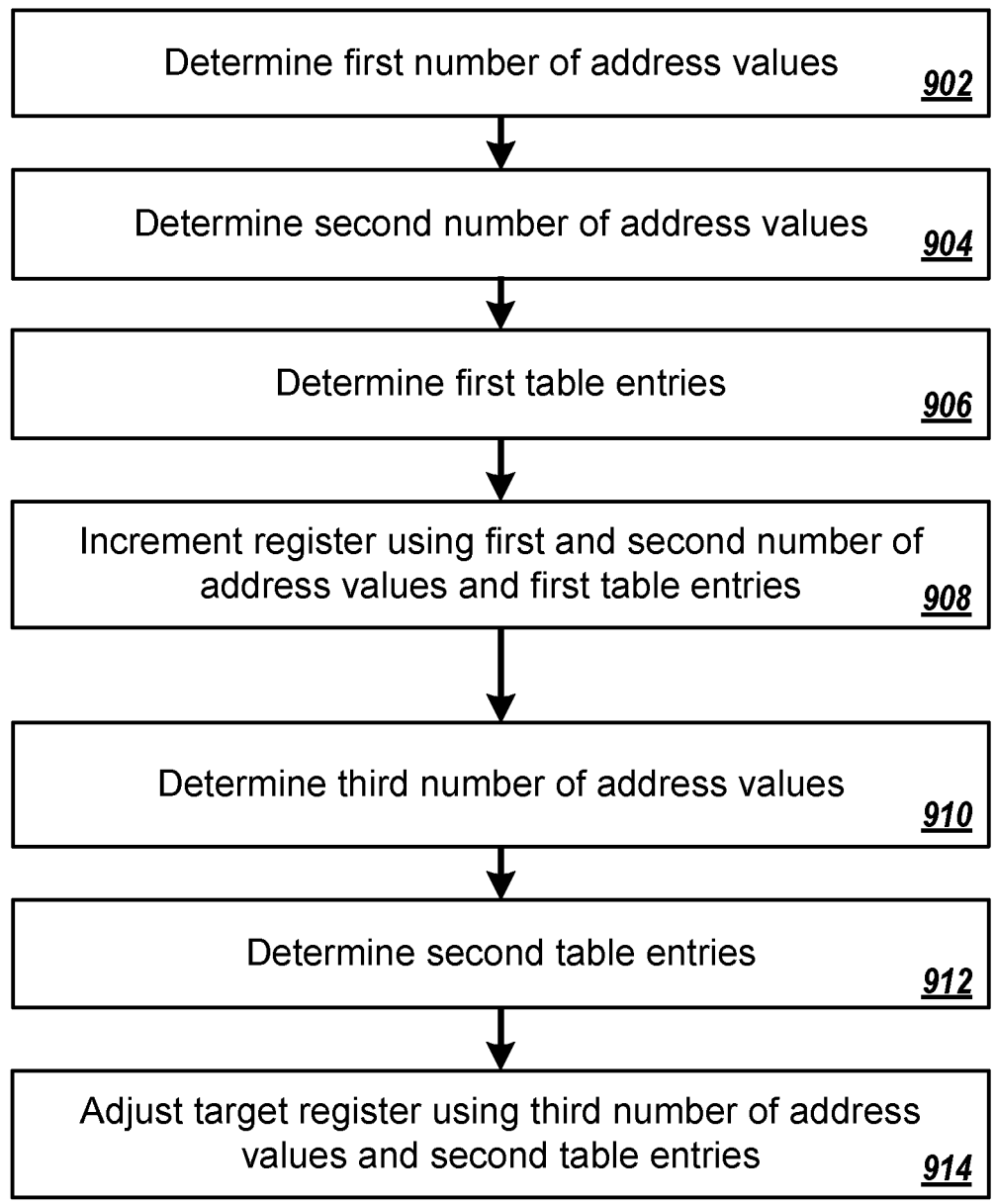
FIG. 9 is a flow diagram of an example process for performing a modular exponentiation operation using a target quantum register of qubits and a source quantum register of qubits.

Programming the Hardware: Example Process for Performing Modular Product Additions FIG. 9 is a flow diagram of an example process 900 for performing a modular exponentiation operation using a target quantum register of qubits and a source quantum register of qubits. For convenience, the process 900 will be described as being performed by a system of one or more classical and quantum computing devices located in one or more locations. For example, a quantum computation system, e.g., the system 200 of FIG. 2, appropriately programmed in accordance with this specification, can perform the process 900.

The modular exponentiation operation performed by example process 900 can be given by $x^* = k^e$ (mod N), where x represents a variable storing a first value in the target quantum register, e represents a corresponding variable storing a second value in the source quantum register, k represents a classical constant scalar value for the modular exponentiation operation, and N represent a classical constant modulo for the modular exponentiation operation. The first value can be a classical integer or a superposition of classical integers. The second value can be a classical integer or a superposition of classical integers.

For each index in a first set of indices, where the first set of indices includes index values between zero and a first maximum index value that is a function of the source quantum register, e.g., equal to the length of the source quantum register, and where the index values are stepped by a first predetermined window size, the system performs steps 902-908.

The system determines a first number of address values by extracting source quantum register values corresponding to indices between i) the index in the first set of indices, and ii) the index in the first set of indices plus the first predetermined window size (step 902). Extracting the source quantum register values is a quantum computation performed by quantum computing devices.

For each index in a second set of indices, where the second set of indices includes index values between zero and a second maximum index value that is a function of the target register, e.g., equal to the length of the target quantum register, and where the index values are stepped by a second predetermined window size, the system performs steps 904, 906, 908.

The system determines a second number of address values by extracting target register values corresponding to indices between i) the index in the second set of indices, and ii) the index in the second set of indices plus the second predetermined window size (step 904). Extracting the target quantum register values is a quantum computation performed by quantum computing devices.

For each index in a third set of indices, where the third set of indices includes index values between 1 and a third maximum value that is based on the first predetermined window size, e.g., $k^{2i+w_1}$ where k represents a scalar for the modular exponentiation operation, i represents the index in the first set of indices, and $w_1$ represents the first predetermined window size, the system performs step 906.

For each index in a fourth set of indices, where the fourth set of indices includes index values between 0 and a fourth maximum value that is a function of the target quantum register and the second predetermined window size, e.g., 2 to the power of the second window size, the system determines a table entry by multiplying i) the index in the third set of indices, ii) the index in the fourth set of indices, and iii) 2 to the power of the index in the second set of indices, and applying a modulus operation (step 906). In some implementations the system can determine entries of the table using classical computation, e.g., classically performed multiplications. The table defined by the determined entries can then be stored in classical memory of the system.

The system adjusts a modular addition register of qubits using table entries corresponding to the first number of address values and the second number of address values (step 908). For example, the system can perform a quantum addition computation using quantum computing devices, e.g., by applying a quantum addition circuit to the modular addition register and a temporary quantum register storing table entries corresponding to the first number of address values and the second number of address values. The quantum addition circuit may include a sequence of quantum logic gates that implement an addition operation.

For each index in a fifth set of indices, where the fifth set of indices includes index values between zero and a fifth maximum index value that is a function of the target register, e.g., equal to the length of the target quantum register, and where the index values are stepped by the second predetermined window size, the system performs steps 910-914.

The system determines a third number of address values by extracting values of the adjusted modular addition register corresponding to indices between i) the index in the fifth set of indices, and ii) the index in the fifth set of indices plus the second predetermined window size (step 910). Extracting the values is a quantum computation performed by quantum computing devices.

For each index in a sixth set of indices, where the sixth set of indices includes index values between 1 and a sixth value that is based on the second predetermined window size, the system performs step 912.

For each index in a seventh set of indices, where the seventh set of indices includes index values between 0 and a seventh maximum value that is a function of the modular addition register and the second predetermined window size, e.g., equal to 2 to the power of the second window size, the system determines a table entry by multiplying i) the index in the sixth set of indices, ii) the index in the seventh set of indices, and iii) 2 to the power of the index in the fifth set of indices, and applying a modulus operation (step 912).

The system adjusts (e.g., through subtraction) the target quantum register using table entries corresponding to the first number of address values and the third number of address values (step 914).

The windowed modular exponentiation described by example process 900 has Toffoli count of $$O\left(\frac{n_e n}{w_e w_m}(n + 2^{w_e + w_m})\right)$$

where $n_e$ represents the number of exponent qubits, n represents the register size, $w_e$ represents the exponent windowing size (the first predetermined window size), and $w_m$ represents the multiplication windowing (the second predetermined window size). In some implementations the first predetermined window size and the second window size can be equal. For example, the first predetermined window size and second predetermined window size can both be equal to ln n/2, where n represents a number of logical qubits in the target quantum register. These window sizes produce a Toffoli count of $$O\left(\frac{n_e n^2}{lg^2 n}\right)$$

which saves two log factors over known, alternative algorithms.

FIG. 10 shows a snippet 1000 of executable python 3 code for performing a modular exponentiation operation. Section 1002 of the snippet 1000 defines the modular exponentiation operation "times_equal_exp_mod", where "target" represents the target quantum register, "Quint" represents a quantum integer, "QuintMod" represents a quantum integer associated with a modulus, "k" represents the constant scalar value for the modular exponentiation operation, "int" represents a classical integer, "e" represents the source quantum register, "e_window" represents the first predetermined window size and "m_window" represents the second predetermined window size.

Section 1004 of the snippet 1000 corresponds to the first set of indices. Section 1006 corresponds to step 902 of example process 900. Section 1008 corresponds to the second set of indices. Section 1010 corresponds to step 904 of example process 900. Section 1012 corresponds to the third, fourth sets of indices and step 906 of example process 900. Section 1014 corresponds to step 908 of example process 900.

Section 1016 of the snippet 1000 corresponds to the fifth set of indices. Section 1018 corresponds to step 910 of example process 900. Section 1020 corresponds to the sixth, seventh set of indices and step 912 of example process 900. Section 1022 corresponds to step 914 of example process 900. Sections 1024 and 1026 are optional routines for a relabeling swap and Xoring a swap result into a correct register.

Implementations of the digital and/or quantum subject matter and the digital functional operations and quantum operations described in this specification and appendix can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators. Quantum computation systems in general and quantum computers specifically may be realized or based on different quantum computational models and architectures. For example, the quantum computation system may be based on or described by models such as the quantum circuit model, one-way quantum computation, adiabatic quantum computation, holonomic quantum computation, analog quantum computation, digital quantum computation, or topological quantum computation.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for performing a product addition operation on a target quantum register of qubits and a source quantum register of qubits, the method comprising:
    determining multiple entries of a lookup table, comprising, for each index in a first set of indices, wherein the first set of indices comprises index values between zero and a maximum index value that is a function of a predetermined window size, multiplying the index value by a scalar for the product addition operation;
    for each index in a second set of indices, wherein the second set of indices comprises index values between zero and a maximum index value that is a function of the source quantum register, wherein the index values are stepped by the predetermined window size:
        determining multiple address values, comprising extracting source register values corresponding to indices between i) the index in the second set of indices, and ii) the index in the second set of indices plus the predetermined window size; and
    adjusting values of the target quantum register based on the determined multiple entries of the lookup table and the determined multiple address values.

2. The method of claim 1, wherein the maximum index value that is a function of the predetermined window size is equal to 2 to the power of the predetermined window size.

3. The method of claim 1, wherein the maximum index value that is a function of the source quantum register is equal to a length of the source register.

4. The method of claim 1, wherein the predetermined window size comprises ln n, where n represents a number of logical qubits in the target quantum register.

5. The method of claim 1, wherein adjusting values of the target quantum register based on the determined multiple entries of the lookup table and the determined multiple address values comprises adding the determined multiple entries into the target quantum register.

6. The method of claim 1, wherein the product addition operation performs x+=ky, where x represents a variable storing a first value in the target quantum register, y represents a corresponding variable storing a second value in the source quantum register, k represents a classical constant scalar value for the product addition operation.

7. The method of claim 6, wherein the target quantum register comprises a fixed width 2s complement register.

8. The method of claim 6, wherein the first value comprises a classical integer or a superposition of classical integers.

9. The method of claim 6, wherein the second value comprises a classical integer or a superposition of classical integers.

10. A method for performing a modular product addition operation using a target quantum register of qubits and a source quantum register of qubits, the method comprising:
    for each index in a first set of indices, wherein the first set of indices comprises index values between zero and a maximum index value that is a function of the source quantum register, wherein the index values are stepped by a predetermined window size:
        determining multiple address values, comprising extracting source register values corresponding to indices between i) the index in the first set of indices, and ii) the index in the first set of indices plus the predetermined window size;
    determining multiple corresponding table entries, comprising, for each index in a second set of indices, wherein the second set of indices comprises index values between zero and a maximum table index that is a function of the predetermined window size:
        determining a table entry comprising a product of i) a scalar in the product addition operation, ii) 2 to the power of the index in the first set of indices, and iii) the index in the second set of indices, and applying a modulus operation to the determined table entry; and
    adjusting values of the target quantum register based on the determined multiple table entries and the determined multiple address values.

11. The method of claim 10, wherein the maximum index value that is a function of the source quantum register is equal to a length of the source quantum register.

12. The method of claim 10, wherein the maximum table index that is a function of the predetermined window size is equal to 2 to the power of the predetermined window size.

13. The method of claim 10, wherein the modular product addition operation performs x+=ky (mod N), where represents a variable storing a first value in the target quantum register, y represents a corresponding variable storing a second value in the source quantum register, k represents a classical constant scalar value for the modular product addition operation, and N represent a classical constant modulo for the modular product addition operation.

14. The method of claim 13, wherein values of x, y and k are positive and less than N.

15. The method of claim 13, wherein the first value comprises a classical integer or a superposition of classical integers.

16. The method of claim 13, wherein the second value comprises a classical integer or a superposition of classical integers.

17. The method of claim 10, wherein the predetermined window size comprises ln n, where n represents a number of logical qubits in the target quantum register.

18. The method of claim 10, wherein adjusting values of the target quantum register based on the determined multiple table entries and the determined multiple address values comprises adding the determined multiple table entries into the target quantum register.

19. The method of claim 10, further comprising performing a series of modular product addition operations to perform a modular multiplication operation.

20. A method for multiplying values of a target quantum register of qubits by an odd integer, the method comprising:
  determining multiple lookup table entries, comprising, for each index in a first set of indices, wherein the first set of indices comprises index values between zero and a maximum table index that is a function of a predetermined window size:
    determining a product of the index in the first set of indices and the odd integer;
  for each index in a second set of indices, wherein the second set of indices comprises index values from a maximum index value that is a function of the target quantum register to zero, wherein the index values are stepped by a predetermined window size:
    extracting multiple values of the target quantum register between the index in the second set of indices to the index in the second set of indices plus the predetermined window size; and
    adjusting multiple values of the target quantum register based on the determined multiple lookup table entries and the extracted multiple values of the target quantum register, wherein the multiple values of the target quantum register comprise values between the index in the second set of indices plus the predetermined window size and an end of the target quantum register.

21. The method of claim 20, wherein the maximum table index that is a function of the predetermined window size is equal to 2 to the power of the predetermined window size.

22. The method of claim 20, wherein the maximum index value that is a function of the target quantum register is equal to a length of the target quantum register.

23. The method of claim 20, wherein multiplying values of a target quantum register of qubits by an odd integer comprises performing x*=k, where x represents a variable storing a first value in the target quantum register and k represents the odd integer.

24. The method of claim 23, wherein the first value comprises a classical integer or a superposition of classical integers.

25. The method of claim 20, wherein the predetermined window size comprises ln n, where n represents a number of logical qubits in the target quantum register.

26. The method of claim 20, wherein adjusting multiple values of the target quantum register based on the determined multiple lookup table entries and the extracted multiple values of the target quantum register comprises adding the determined multiple lookup table entries into the target quantum register.

27. An apparatus comprising:
  one or more classical computing processors; and
  quantum computing hardware in data communication with the one or more classical processors,
  wherein the apparatus is configured to perform operations for performing a product addition operation on a target quantum register of qubits and a source quantum register of qubits, the operations comprising:
    determining multiple entries of a lookup table, comprising, for each index in a first set of indices, wherein the first set of indices comprises index values between zero and a maximum index value that is a function of a predetermined window size, multiplying the index value by a scalar for the product addition operation;
    for each index in a second set of indices, wherein the second set of indices comprises index values between zero and a maximum index value that is a function of the source quantum register, wherein the index values are stepped by the predetermined window size:
      determining multiple address values, comprising extracting source register values corresponding to indices between i) the index in the second set of indices, and ii) the index in the second set of indices plus the predetermined window size; and
    adjusting values of the target quantum register based on the determined multiple entries of the lookup table and the determined multiple address values.

* * * * *